US010566315B2

(12) United States Patent
Tseng

(10) Patent No.: US 10,566,315 B2
(45) Date of Patent: Feb. 18, 2020

(54) PIXEL UNIT STRUCTURE AND MANUFACTURING METHOD THEREOF

(71) Applicant: Shih-Hsien Tseng, Hsinchu (TW)

(72) Inventor: Shih-Hsien Tseng, Hsinchu (TW)

( * ) Notice: Subject to any disclaimer, the term of this patent is extended or adjusted under 35 U.S.C. 154(b) by 0 days.

(21) Appl. No.: 16/195,726

(22) Filed: Nov. 19, 2018

(65) Prior Publication Data

US 2019/0139942 A1 May 9, 2019

Related U.S. Application Data

(63) Continuation of application No. 15/591,135, filed on May 10, 2017, now Pat. No. 10,170,452.

(30) Foreign Application Priority Data

May 11, 2016 (TW) .............................. 105114543 A

(51) Int. Cl.
*H01L 27/32* (2006.01)
*H01L 25/07* (2006.01)
*G02F 1/136* (2006.01)
*H01L 25/16* (2006.01)
*H01L 27/12* (2006.01)
*H01L 23/48* (2006.01)
*H01L 23/498* (2006.01)
(Continued)

(52) U.S. Cl.
CPC ............ *H01L 25/072* (2013.01); *G02F 1/136* (2013.01); *H01L 23/481* (2013.01); *H01L 23/49838* (2013.01); *H01L 25/0655* (2013.01); *H01L 25/167* (2013.01); *H01L 25/18* (2013.01); *H01L 25/50* (2013.01); *H01L 27/1218* (2013.01); *H01L 27/32* (2013.01); *H01L 27/3262* (2013.01); *H01L 29/786* (2013.01); *G02F 2001/13613* (2013.01); *H01L 25/075* (2013.01); *H01L 25/0753* (2013.01); *H01L 27/156* (2013.01)

(58) Field of Classification Search
CPC ..... H01L 25/072; H01L 27/32; H01L 25/167; H01L 29/786; H01L 27/3262; H01L 23/481; H01L 25/50; H01L 25/18; H01L 25/0655; H01L 23/49838; H01L 27/156; H01L 25/0753; H01L 25/075; G02F 1/136; G02F 2001/13613
See application file for complete search history.

(56) References Cited

U.S. PATENT DOCUMENTS

2004/0179165 A1 9/2004 Kinoshita
2005/0030264 A1* 2/2005 Tsuge ................... G09G 3/3233
345/76

* cited by examiner

*Primary Examiner* — David Vu
(74) *Attorney, Agent, or Firm* — Winston Hsu

(57) ABSTRACT

A pixel unit structure, as well as a manufacturing method thereof, is provided. The pixel unit structure includes a display medium module and an active switching element. The display medium module includes a first electrode, a second electrode and a display medium. The first electrode and the second electrode are separated from each other, and the display medium is disposed between the first electrode and the second electrode. The active switching element is electrically connected to the first electrode, for allowing the first electrode and the second electrode to change the state of the display medium. The active switching element includes a wafer portion and a transistor portion, which is formed on the wafer portion. Therefore, the active switching element can be manufactured independently without the restriction from the display medium module.

20 Claims, 15 Drawing Sheets

(51) Int. Cl.
  *H01L 25/065* (2006.01)
  *H01L 25/18* (2006.01)
  *H01L 25/00* (2006.01)
  *H01L 29/786* (2006.01)
  *H01L 25/075* (2006.01)
  *H01L 27/15* (2006.01)

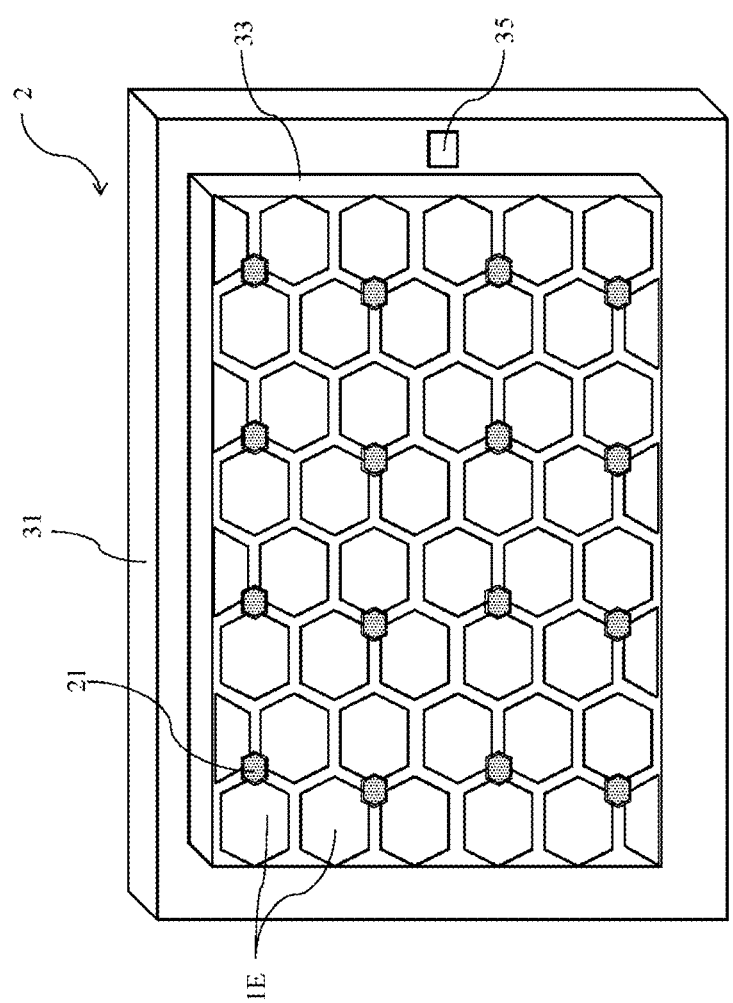

PIXEL UNIT STRUCTURE AND MANUFACTURING METHOD THEREOF

CROSS REFERENCE TO RELATED APPLICATIONS

This is a continuation application of U.S. patent application Ser. No. 15/591,135, filed May 10, 2017, the entire contents of which being incorporated herein by reference.

BACKGROUND OF THE INVENTION

1. Field of the Invention

The present invention relates to a pixel unit structure and a manufacturing method thereof, and more specifically, the present invention relates to a pixel unit structure with a display medium module and a manufacturing method thereof.

2. Description of the Prior Art

With the advancement of technology, users are getting more demanding about visual display and require display devices with the advantages of compactness, excellent display quality, large-sized panel, high color saturation, low cost and low power consumption.

Existing display devices may be categorized into self-luminous and non-self-luminous ones. Liquid crystal display (LCD) devices are one of the primary non-self-luminous flat panel display devices, wherein the amount of light passing through a liquid crystal medium is modulated by controlling the voltage of the upper and lower electrodes of the liquid crystal medium. The effect of color display is achieved with further employment of a color filter layer, a polarizer and some optical films.

Self-luminous flat panel display devices may be categorized into field emissive display, plasma display, electroluminescent display, organic light-emitting diode display and so on. In an organic light-emitting diode display (OLED), light-emitting polymers are deposited between an upper electrode layer and a lower electrode layer. With further employment of a conductive layer of electrons and holes, light is generated by means of an external electric field which moves the carriers and causes the electrons and holes to re-combine. In comparison, an organic light-emitting diode display device is characterized by its wide viewing angle, fast responding speed, thin panel and flexibility; further, it requires neither backlighting nor color filter and may be made large-sized.

The display panel of both LCD and OLED devices has a plate of transparent glass for a substrate, directly forming a thin-film transistor, a lower electrode layer, a display medium layer, an upper electrode layer and others thereon. The thin-film transistor may control the voltage or current imposed on the upper electrode layer and/or the lower electrode layer to control the state of the display medium.

However, a glass substrate may not endure a high annealing temperature (the strain temperature of glass being around 650° C.). Therefore, the manufacturing process of the foregoing elements has to be performed at a relatively low temperature. This may cause a low mobility rate of electron in the thin-film transistor, which means a larger-sized transistor is required for providing sufficient charging ability.

Further, the larger the size of the glass substrate, the larger the area of the thin-film transistor formed on the glass substrate (that is, the array of the thin-film transistor has larger dimensions). The manufacturing process of the thin-film transistor will have the disadvantages of expensive equipment, complicated manufacturing process, longer manufacturing time, and unstable mass production quality and yield rate. Therefore, a large-dimensioned array of thin-film transistor is harder to manufacture and its manufacturing cost is higher.

In view of the foregoing, existing display devices still have various disadvantages to overcome.

SUMMARY OF THE INVENTION

It is a primary object of the present invention to provide a pixel unit structure and a manufacturing method thereof, wherein the pixel unit structure may be applied in a display device to improve one of the disadvantages of existing display devices, for example, to improve the manufacturing yield rate, lower the manufacturing cost, reduce the manufacturing time, or improve the mobility rate of electron, and so on.

To achieve the foregoing object, the present invention provides a pixel unit structure comprising a display medium module and an active switching element. The display medium module comprises a first electrode, a second electrode and a display medium. The first electrode and the second electrode are separated from each other, and the display medium is disposed between the first electrode and the second electrode. The active switching element is electrically connected to the first electrode for allowing the first electrode and the second electrode to change the state of the display medium. The active switching element comprises a wafer portion and a transistor portion, with the transistor portion formed on the wafer portion.

To achieve the foregoing object, the present invention provides a manufacturing method for manufacturing a pixel unit structure according to the present invention, comprising the following steps: separately manufacture a display medium module and an active switching element; assemble the active switching element on the display medium module; wherein the display medium module comprises a first electrode, a second electrode and a display medium, the first electrode and the second electrode are separated from each other, the display medium is disposed between the first electrode and the second electrode, the active switching element comprises a wafer portion and a transistor portion with the transistor portion formed on the wafer portion, and the active switching element is electrically connected to the first electrode for allowing the first electrode and the second electrode to change the state of the display medium.

Thus, a pixel unit structure and a manufacturing method thereof according to the present invention may provide at least the following advantageous effects: the active switching element is manufactured before being assembled on the display medium module; that is, the active switching element is not directly manufactured on some portion of the display medium module. As such, the manufacturing process condition of the active switching element may be less restricted by the characteristics of the display medium module (e.g. material property). Further, the active switching element is manufactured on a wafer, which may endure a higher processing temperature, and the processing technique of wafers is also more matured and advanced. Therefore, active switching elements manufactured on wafers may have better characteristics (e.g. a higher yield rate or a faster mobility rate of electron in a transistor).

On the other hand, the pixel unit structure may be independently disposed, assembled and disassembled. In the case of a display panel composed of a plurality of pixel unit structures, a damaged pixel unit structure may be disassembled and replaced by a new one. As such, there is no need to replace an entire display panel for the sake of a single damaged pixel unit structure.

The foregoing objects, technical features and advantages of the present invention will become apparent after the following detailed description of preferred embodiments in conjunction with the attached drawings.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 7A is a three-dimensional view of a display device according to a sixth preferred embodiment of the present invention;

DETAILED DESCRIPTION

Figure 1:
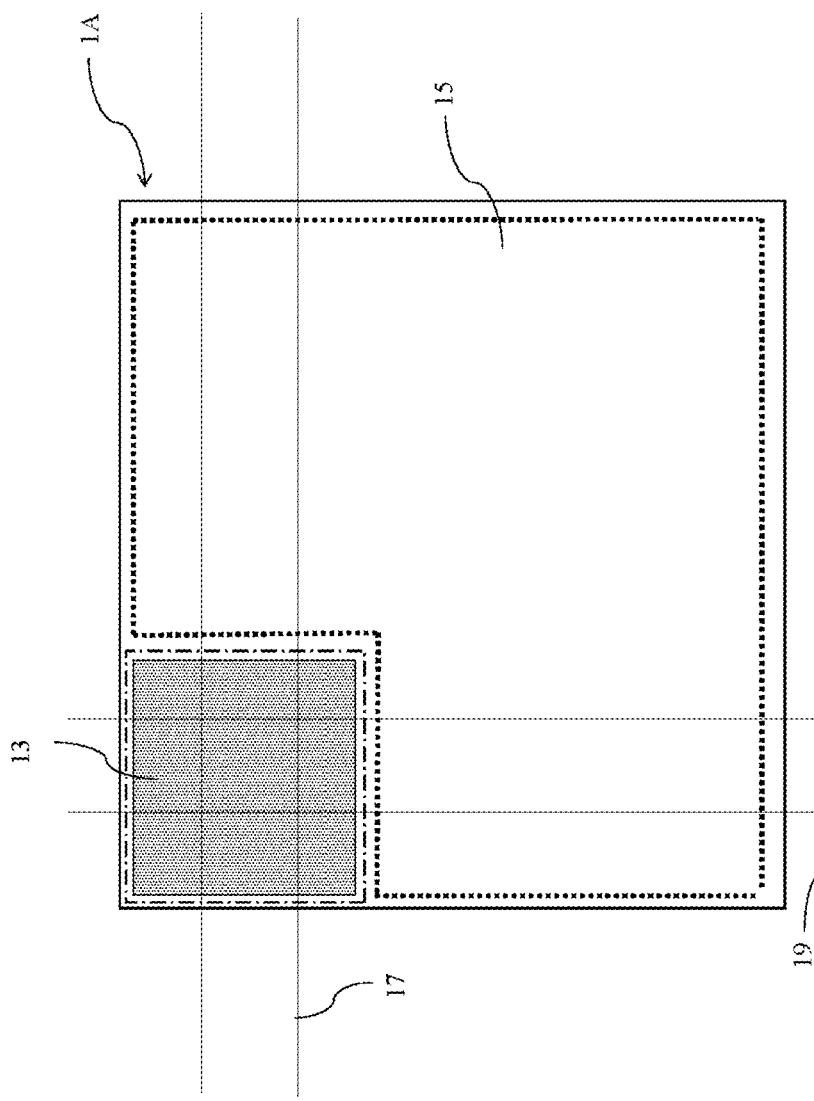
FIG. 1 is a top view of a pixel unit structure according to a first preferred embodiment of the present invention.

The implementation method of the present invention will be further illustrated by way of the following description of six preferred embodiments. But it should be noted that the six preferred embodiments described below are illustrative and exemplary only rather than limiting the application of the present invention to the described environment, application, structure, procedure or steps. Elements that are not directly related to the present invention are ignored from the drawings. The scale relations among elements in the drawings are illustrated rather than limiting of the actual scales of the present invention. Unless noted otherwise, identical (or similar) reference symbols correspond to identical (or similar) elements.

Please refer to FIG. 1, showing a top view of a pixel unit structure 1A according to a first preferred embodiment of the present invention. The pixel unit structure 1A may serve as part of a display panel (not shown in the drawing) for displaying a pixel part of an image; that is, a display panel may include one or a plurality of pixel unit structures 1A according to the present embodiment. The pixel unit structure 1A may include an active switching element 13, a display medium module 15 and other elements. The active switching element 13 may be used to control the state of the display medium module 15 to further control the amount of light passing through a display medium module 15 (or modulating the properties of light). More specific technical contents will be illustrated below.

Figure 2A:
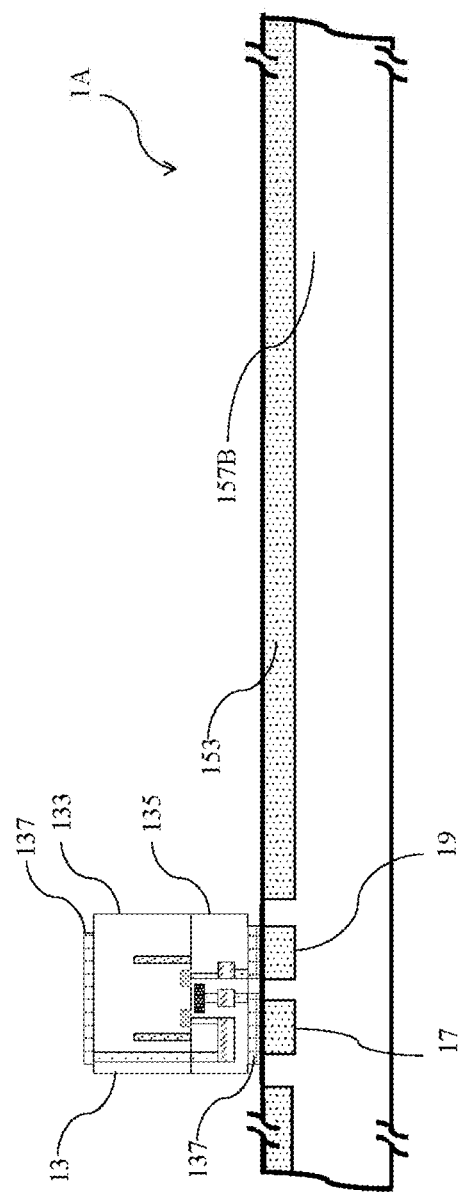
FIGS. 2A and 2B are cross-section views of the pixel unit structure of FIG. 1.
Figure 2B:
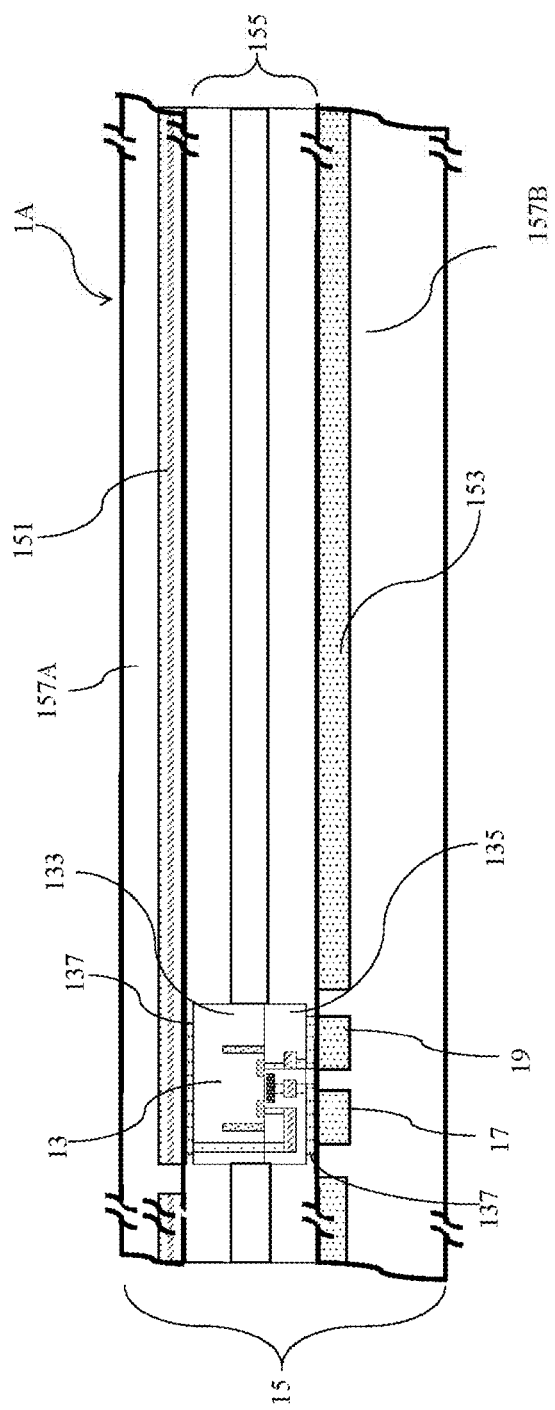

Please refer to both FIGS. 2A and 2B, showing cross-section views of the pixel unit structure 1A of FIG. 1. The active switching element 13 may include a wafer portion 133 and a transistor portion 135, with the transistor portion 135 formed on the wafer portion 133. That is, the wafer portion 133 is part of a wafer (not shown in the drawings). The wafer may be silicon wafer, gallium arsenide wafer, sapphire wafer, indium phosphide wafer or gallium nitride wafer and so on (silicon wafer is used in the present preferred embodiment). The transistor portion 135 is formed on the wafer by a semiconductor manufacturing process (exposure, development, etching, diffusion, deposition, and so on). A plurality of transistor portions 135 may be simultaneously formed on the wafer and then the wafer may be divided into a plurality of parts by a cutting process (with each part including one or more transistor portions 135). Each of these parts is a foregoing active switching element 13. The active switching element 13 may also be regarded as a chip or die.

Further, the transistor portion 135 may be formed of one of the following semiconductor materials: silicon, silicon on insulator (SOI), germanium, selenium, gallium arsenide, gallium nitride, three-five compound, two-six compound, four-four compound, four-four alloy, amorphous silicon, and a combination thereof. In addition, the active switching element 13 may also include a plurality of electrodes 137 formed on the wafer portion 133 and/or the transistor portion 135 for electrically connecting to the source electrode, gate electrode and drain electrode of the transistor portion 135 separately.

The display medium module 15 comprises a first electrode 151, a second electrode 153 and a display medium 155. The first electrode 151 and the second electrode 153 are separated from each other and may face each other. And the display medium 155 is disposed between the first electrode 151 and the second electrode 153. The first electrode 151 and the second electrode 153 may also be called pixel electrode and common electrode and may be transparent electrodes (e.g. formed of indium tin oxide). Electrical energy may be imposed on the first electrode 151 and the second electrode 153 to change the magnitude and/or the direction of the voltage, current, inductance, capacitance, electrical field, and magnetic field between the first electrode 151 and the second electrode 153 and one of the combinations thereof.

The first electrode 151 may also be electrically connected to the active switching element 13 (e.g. via the electrode 137 of the active switching element 13). The active switching element 13 may control whether electrical energy is to be imposed on the first electrode 151 and/or the second electrode 153.

The display medium 155 may also be called light modulation medium. Its state may be changed via the first electrode 151 and the second electrode 153 to control the amount of light passing through (or modulate the properties of light). Specifically, the active switching element 13 may control the electrical energy imposed on the first electrode 151 and/or the second electrodes 153, causing the voltage and so on between the first electrode 151 and the second electrode 153 to change, which causes the state of the display medium 155 to change. In the case of a display medium 155 made of non-self-luminous liquid crystal, change in the state of the display medium 155 means torsion of the liquid crystal. In the case of a display medium 155 made of self-luminous organic light-emitting diode, change in the state of the display medium 155 means light generation of the organic light-emitting diode. The type of the display medium 155 is relevant to the configuration of the first electrode 151 and the second electrode 153. For example, if the display medium 155 is in-plane-switching liquid crystal, the first electrode 151 and the second electrode 153 may be arranged on the same plane.

Besides non-self-luminous and self-luminous medium materials, in other preferred embodiments the display medium 155 may also include color filter material, conductive material, insulating material, light absorbing material, light reflecting material, photo refractive material, light deflecting material, light diffusing material and at least one of the foregoing materials (the foregoing materials may be formed on the first substrate 157A and/or the second substrate 157B described below, or may be formed into a plate body before being disposed on the first substrate 157A and/or the second substrate 157B). Non-self-luminous medium materials may include at least one of electrophoretic material, electric fluid material, liquid crystal material, micro electromechanical reflective material, electrowetting material, electric ink material, magnetic fluid material, electrochromic material, electromorphous material and thermochromic material. Self-luminous medium materials may include at least one of electroluminescent material, photoluminescent material, cathodoluminescent material, field emissive luminescent material, vacuum fluorescent material and light-emitting diode material for producing white, red, green, blue, orange, yellow and other colors, or combinations thereof.

The display medium module 15 may also include a first substrate 157A and a second substrate 157B, which are disposed facing each other and separate from each other and are used for supporting the first electrode 151, the second electrode 153 and/or the display medium 155. The first electrode 151 may be disposed on the first substrate 157A, the second electrode 153 may be disposed on the first substrate 157A and/or the second substrate 157B (depending on the type of the display medium 155), and the display medium 155 may be disposed between the first substrate 157A and the second substrate 157B (or, when the display medium module 15 comprises only one of the first substrate 157A and the second substrate 157B, the display medium 155 may be disposed on the first substrate 157A or the second substrate 157B). The active switching element 13 may be disposed on the first substrate 157A and/or the second substrate 157B, but not directly manufactured on the first substrate 157A and/or the second substrate 157B; that is, the active switching element 13 is manufactured before being assembled to the first substrate 157A and/or the second substrate 157B. Further, the active switching element 13 may be disposed on a surface of the first substrate 157A and/or the second substrate 157B.

The first substrate 157A or the second substrate 157B may be made of (but not limited to) the following materials: transparent material, opaque material, flexible material, rigid material, metallic material, ceramic material, insulating material, metal compound material, metal alloy material, organic material, inorganic material, composite material, semiconductor material and one of the combinations thereof.

In the present preferred embodiment, the first substrate 157A and the second substrate 157B are made of transparent material (such as glass).

The foregoing flexible material may include: polyethylene naphthalate (PEN), polyvinyl chloride (PVC), polyethersulfone (PES), polyethylene terephthalt (PET), polyarylate (PAR), polystyrene (PS), polycarbonate (PC), polyimide (PI), polymethyl methacrylate (PMMA), polyacrylonitrile (PAN), polyamide (PA) and one of the combinations thereof.

The pixel unit structure 1A may also include a control signal line 17 and a data signal line 19. The control signal line 17 and the data signal line 19 may be formed on the first substrate 157A and/or the second substrate 157B and electrically connected to the active switching element 13 (e.g. via the electrode 137 of the active switching element 13). The on and off of the active switching element 13 may be controlled via the control signal line 17, and electrical energy (i.e. pixel content, which is represented in the form of voltage or electric current) may optionally be transmitted to the active switching element 13 via the data signal line 19 and be further imposed on the first electrode 151. The control signal line 17, data signal line 19, first electrode 151 and/or second electrode 153 may be located on a same horizontal layer or on different horizontal layers of the first substrate 157A and/or the second substrate 157B.

Further, the control signal line 17, data signal line 19, first electrode 151 and/or second electrode 153 may be made of (but not limited to) the following materials: transparent conductive material, non-transparent conductive material, flexible conductive material, rigid conductive material, metallic conductive material, metal compound material, metal alloy material, organic conductive material, inorganic conductive material, and composite conductive material, and one of the combinations thereof.

As illustrated above, the active switching element 13 is made from a wafer and not directly formed on some portion of the display medium module 15. Therefore, the manufacturing of the active switching element 13 may not be restricted by the characteristics of the display medium module 15. In addition, when the active switching element 13 is manufactured on a wafer, since wafers may endure a higher processing temperature, and since wafer processing technique is more matured and advanced, the active switching element 13 manufactured on a wafer may have better characteristics (e.g. of a smaller size, with a higher yield rate or a faster mobility rate in a transistor).

Further, it has been noted above that the display panel (not shown in the drawings) may include a plurality of pixel unit structures 1A. In this type of configuration, the first substrate 157A of the display medium module 15 in these pixel unit structures 1A may be connected and integrated and so may the second substrate 157B. One of the first electrode 151 and the second electrode 153 may also be connected and integrated to serve as a common electrode.

The foregoing description illustrates the technical content of a pixel unit structure 1A according to the present preferred embodiment. The technical content of pixel unit structures 1A according to other preferred embodiments of the present invention is described below. The technical content of the pixel unit structure in each of these preferred embodiments may be cross-referenced, so identical description is omitted or simplified.

Figure 3A:
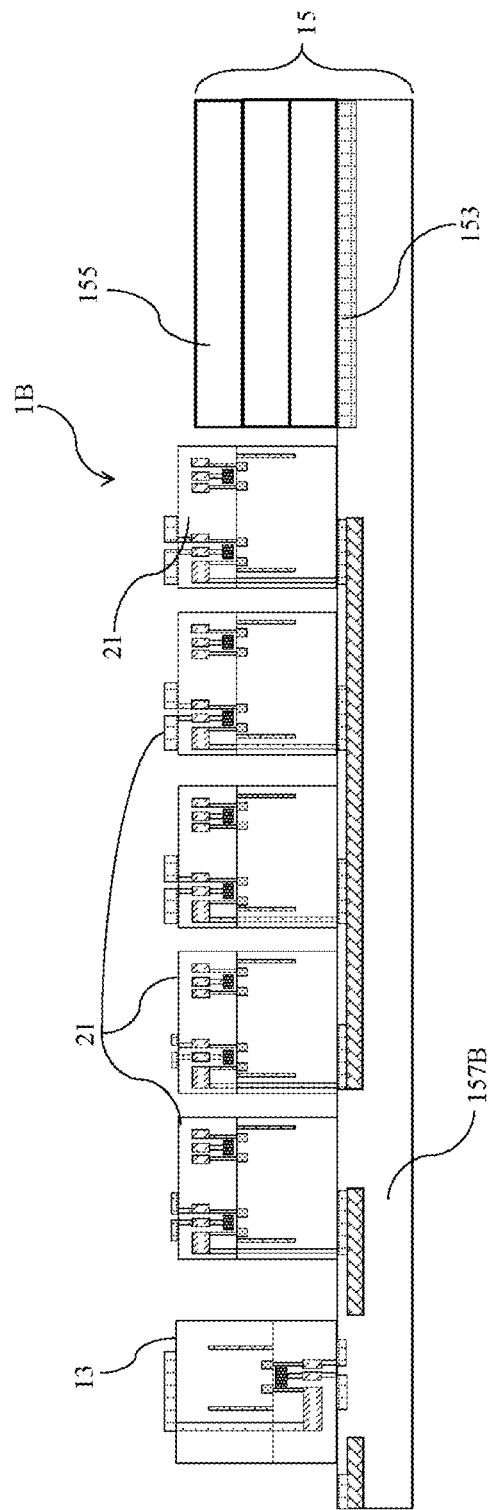
FIGS. 3A to 3C are cross-section views of a pixel unit structure according to a second preferred embodiment of the present invention.

Please refer to FIG. 3A, showing a cross-section view of a pixel unit structure 1B according to a second preferred embodiment of the present invention. The pixel unit structure 1B is similar to the pixel unit structure 1A, both including an active switching element 13 and a display medium module 15. The pixel unit structure 1B further comprises one or a plurality of functional elements 21 (a plurality of functional elements 21 are employed as an example in the present preferred embodiment).

The plurality of functional elements 21 are electronic elements each having (but not limited to) a specific function, for example: one of a touch sensing functional element, a displacement sensing functional element, a hygrothermal sensing functional element, an acoustic sensing functional element, an electromagnetic sensing functional element, an image capturing functional element, a memory functional element, a control functional element, a wireless communication functional element, a self-luminous functional element, a passive functional element (inductor, resistor, capacitor or a combination thereof) and a photovoltaic functional element.

The touch sensing functional element may include: one of a photo-sensing element, a piezoelectric sensing element, a capacitance sensing element, a resistance sensing element, an inductance sensing element, an electromagnetic sensing element, an electric charge sensing element, a voltage sensing element, a current sensing element and an acoustic sensing element.

The plurality of functional elements 21 may be disposed on the first substrate (not shown in the drawing) and/or the second substrate 157B of the display medium module 15, but not directly formed on some portion of the display medium module 15. That is, the functional elements 21 are manufactured before being assembled on the display medium module 15. Therefore, the functional elements 21 can also be manufactured independently without the restriction from the characteristics of the display medium module 15. The functional elements 21 may be electrically connected to the active switching element 13, control signal line 17, or data signal line 19 (or the pixel unit structure 1B may include other signal lines or electrodes for electrically connecting to the functional elements 21) for achieving the controlling functions of the functional elements 21, being controlled by the functional elements 21, transmitting signals to the functional elements 21, or receiving signals from the functional elements 21, and so on.

With the functional elements 21, the pixel unit structure 1B may provide other functions besides image display (display, touch, sensing, photography, data transmission, power generation, and so on). For example, an image capturing functional element may enable the pixel unit structure 1B to capture part of an image; a memory functional element may record the state of the pixel medium 155 or the data of the functional element 21 itself; a control functional element may control the active switching element 13; a wireless communication functional element may wirelessly transmit and receive data from the control module of a display device (which will be further described in the preferred embodiments below); a photovoltaic functional element may convert ambient light illumination into electrical power, and so on.

Figure 3B:
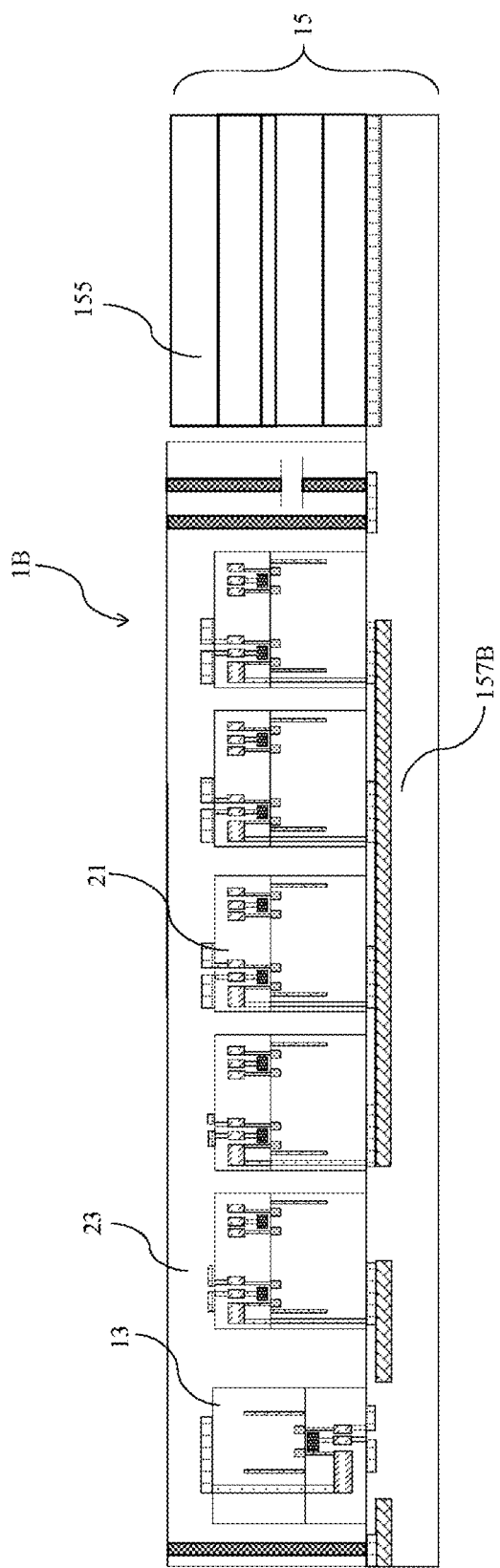

Please refer to FIG. 3B, showing another cross-section view of a pixel unit structure 1B according to a second preferred embodiment of the present invention. The pixel unit structure 1B may optionally further include a package carrier 23, therein may be packaged an active switching element 13 and/or functional elements 21 before the package carrier 23 is assembled to the display medium module 15. That is, after the active switching element 13 or functional elements 21 are manufactured on a wafer, they may be first packaged in a package carrier 23 before being assembled to the display medium module 15. The active switching element 13 and functional elements 21 may be manufactured on a same wafer (or on different wafers) and then packaged together in the package carrier 23. The package carrier 23 may protect the active switching element 13 and functional elements 21 and may facilitate the process of assembling them to the display medium module 15.

The manufacture material of the package carrier 23 may include (but not limited to): semiconductor material, conductive material, insulating material, organic material, inorganic material, metallic material, metallic alloy material, ceramic material, compound material, transparent material, opaque material, flexible material, rigid material, non-metallic material, and one of the combinations thereof. The package carrier 23 may also include a substrate, a conductive line, a conductive connecting pad, a conductive connecting pole, a conductive connecting bump, a conductive connecting joint, an insulating medium layer, an insulating medium, an adhesive medium, a connecting wire, or a combination thereof, and so on.

Figure 3C:
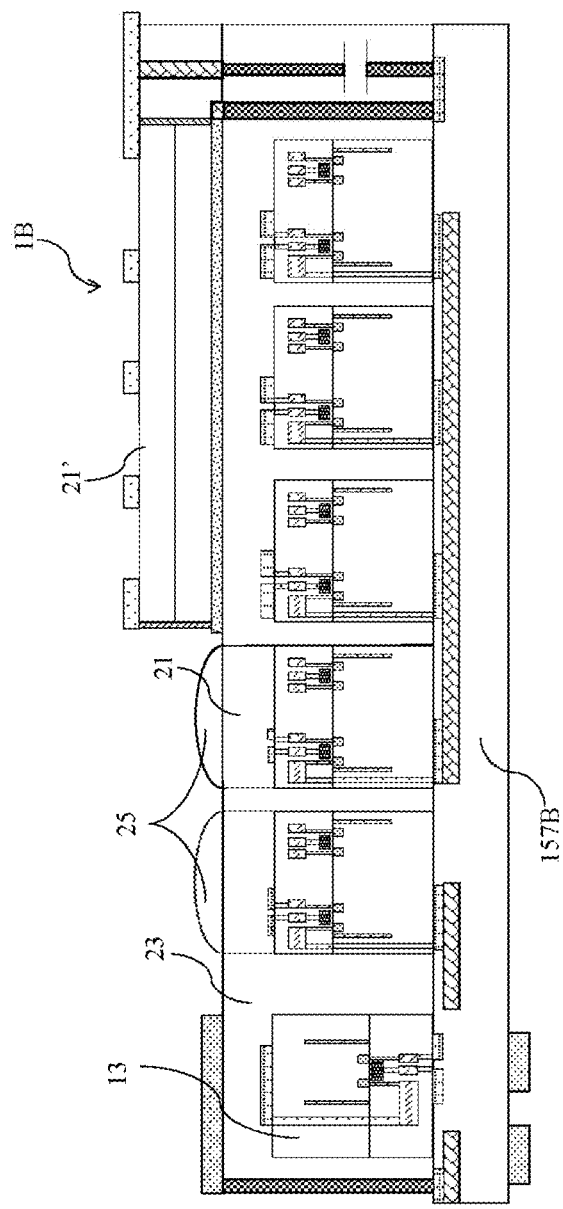

Please refer to FIG. 3C, showing another cross-section view of a pixel unit structure 1B according to a second preferred embodiment of the present invention. After the active switching element 13 and the functional elements 21 are packaged in the package carrier 23, other functional elements 21' may also be disposed on the package carrier 23 (e.g. photovoltaic functional element, which may convert ambient light illumination into electric power to be provided to the package carrier 23. The pixel unit structure 1B may include one or a plurality of optical elements 25, which are disposed or formed on the package carrier 23 and positioned in correspondence to functional elements 21 related to optics (e.g. image capturing functional element). The optical elements 25 may include at least one of a convex lens, a concave lens and an optical prism for changing the direction of ambient light illumination to be received by the functional elements 21.

Figure 4A:
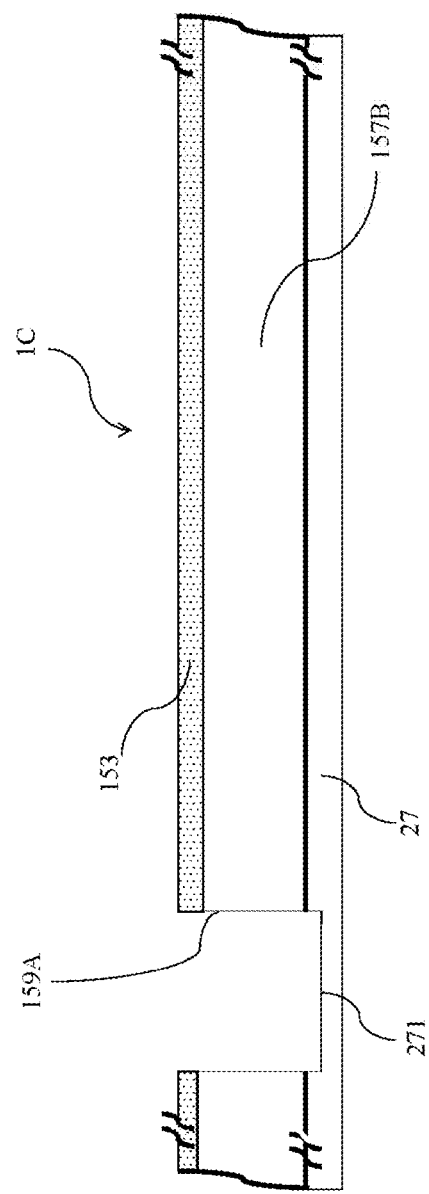
FIGS. 4A and 4B are cross-section views of a pixel unit structure according to a third preferred embodiment of the present invention.
Figure 4B:
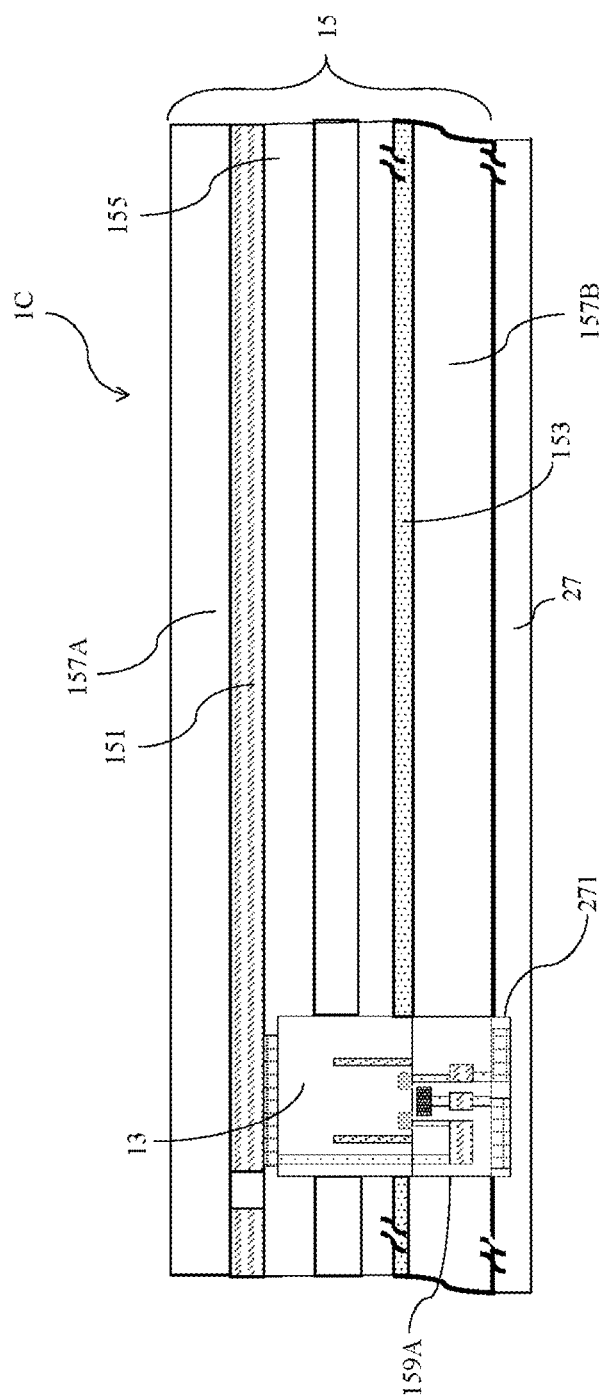

Please refer to FIGS. 4A and 4B, showing cross-section views of a pixel unit structure 1C according to a third preferred embodiment of the present invention. The pixel unit structure 1C is similar to the pixel unit structure 1A, both including an active switching element 13 and a display medium module 15. The pixel unit structure 1C further comprises a carrier board 27.

Specifically, the carrier board 27 may allow the display medium module 15 to be disposed thereon, and the active switching element 13 may be disposed on the carrier board 27. The carrier board 27 may also include a wire, an electrode and other elements for the display medium module 15 and the active switching element 13 to be electrically connected to each other. The control signal line 17 and the data signal line 19 may also be formed on the carrier board 27 and connected to the active switching element 13.

Further, the carrier board 27 may include a concave groove 271 (or through hole), wherein may the active switching element 13 be disposed. The first substrate 157A and/or the second substrate 157B of the display medium module 15 may also include a through hole 159A, and the active switching element 13 may be disposed in the concave groove 271 through the through hole 159A. The carrier board 27 may also include a sidewall insulating layer, an electric conductive pole, an electric conductive pad, an insulating medium or a combination thereof, which are disposed in the concave groove 271 for electrically connecting the active switching element 13 to other elements or isolating the active switching element 13 from other elements.

The disposition of the carrier board 27 facilitates the electrical connection arrangement among the elements of the pixel unit structure 1C, especially when the pixel unit structure 1C comprises a plurality of functional elements (not shown in the drawings).

Figure 5A:
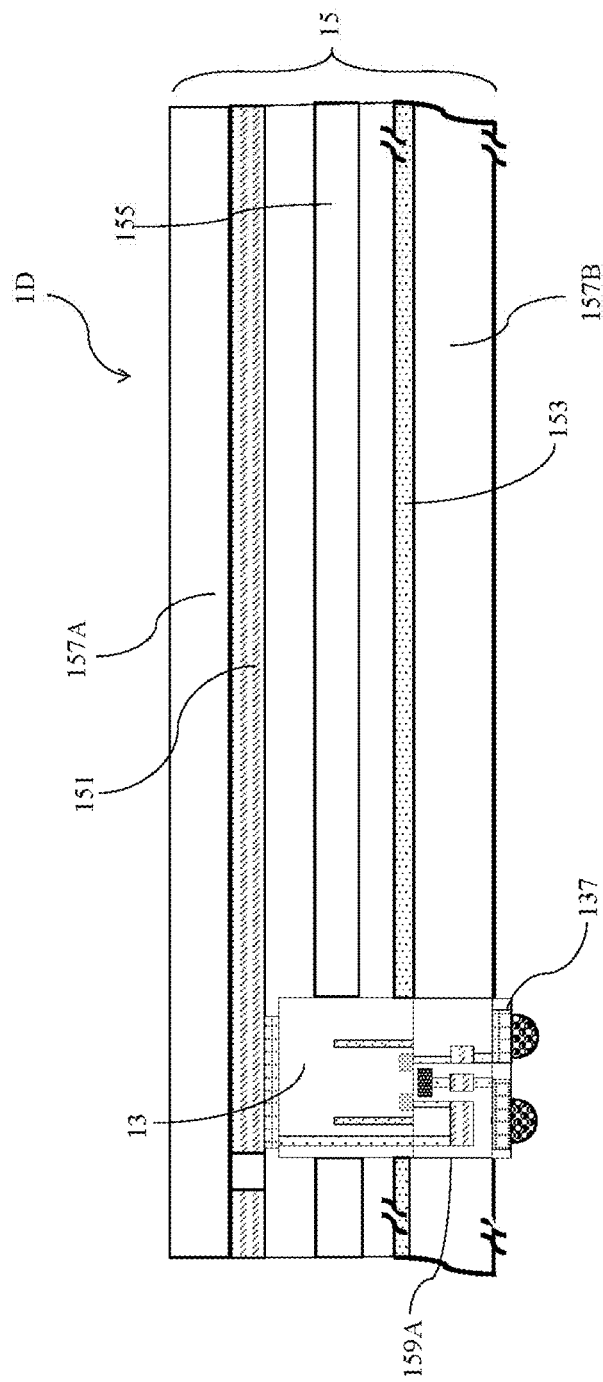
FIGS. 5A and 5B are cross-section views of a pixel unit structure according to a fourth preferred embodiment of the present invention.
Figure 5B:
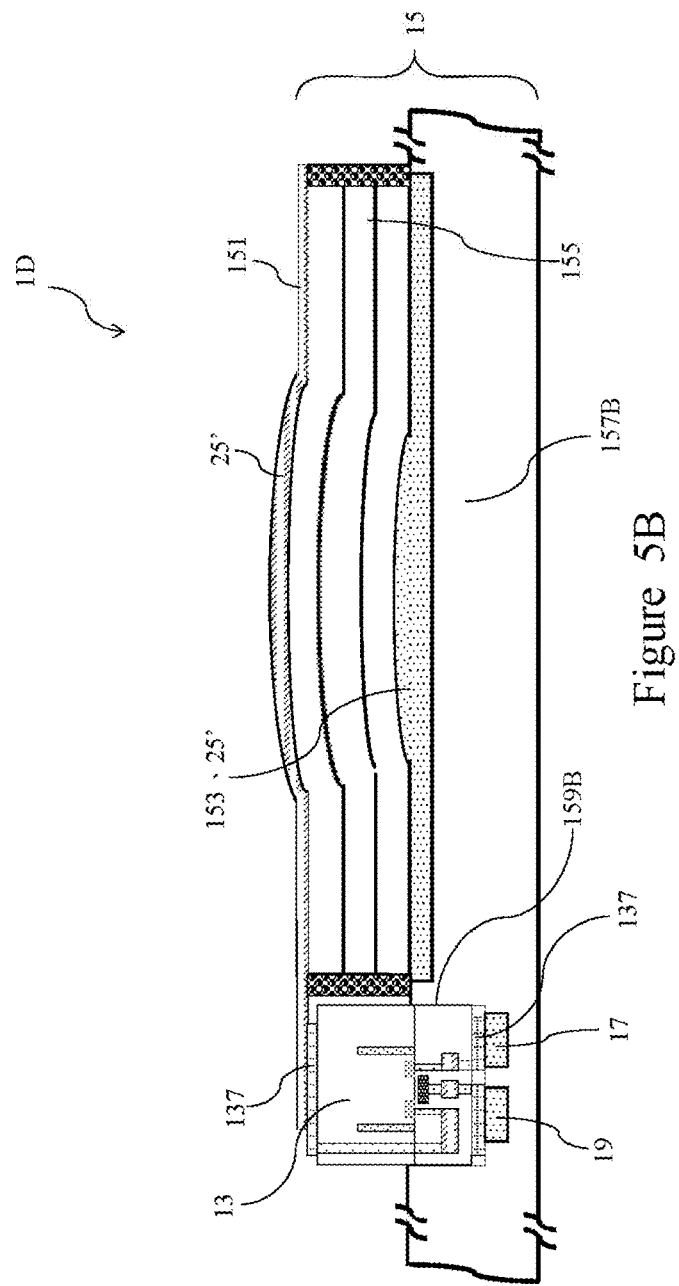

Please refer to FIGS. 5A and 5B, showing cross-section views of a pixel unit structure 1D according to a fourth preferred embodiment of the present invention. The pixel unit structure 1D is similar to the pixel unit structure 1A, except that the first substrate 157A and/or the second substrate 157B of the pixel unit structure 1D comprises a through hole 159A and/or a concave groove 159B.

As FIG. 5A shows, when the active switching element 13 is disposed in the through hole 159A, its electrode 137 may be exposed on the first substrate 157A and/or the second substrate 157B. Then on the electrode 137 may be disposed solder, solder wire, solder bump and so on for electrically connecting the electrode 137 to other elements. As FIG. 5B shows, when the active switching element 13 is disposed in the concave groove 159B, the active switching element 13 only partially protrudes from the first substrate 157A and/or the second substrate 157B, and the active switching element 13 may be electrically connected to the control signal line 17 and the data signal line 19 in the concave groove 159B.

The pixel unit structure 1D may also include an optical element 25', which may be formed in the display medium module 15, e.g. formed on the first electrode 151 or the second electrode 153 (or the optical element 25' is directly formed from the first electrode 151 or the second electrode 153), and which may be optically coupled with the display medium 155. As such, the optical element 25' may guide ambient light illumination into the display medium module 15, and then the display medium 155 may modulate the amount or characteristics of the ambient light illumination leaving the display medium module 15. When there is sufficient ambient light illumination, the pixel unit structure 1D may directly use the ambient light illumination to achieve the function of image pixel display or light modulation. The optical element 25' may include at least one of a convex lens, a concave lens and an optical prism.

Described below are a manufacturing method of a pixel unit structure according to the present invention and its application as a display device.

Figure 6:
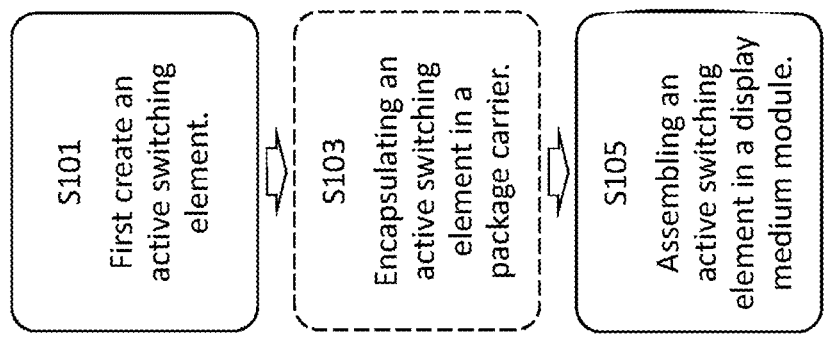
FIG. 6 is a flow diagram showing a manufacturing method of a pixel unit structure according to a fifth preferred embodiment of the present invention.

Please refer to FIG. 6, showing a flow diagram of a manufacturing method of a pixel unit structure according to a fifth preferred embodiment of the present invention. The manufacturing method may produce one or a plurality of identical or similar pixel unit structures 1A to 1D of the foregoing preferred embodiments. Therefore, the technical content of the manufacturing method and the technical content of the pixel unit structures 1A to 1D may be cross-referenced.

As Step S101 shows, firstly manufacture an active switching element; that is, in contrast with a display medium module of a pixel unit structure, the active switching element is independently manufactured, rather than being directly manufactured on the display medium module. The functional elements are also manufactured in advance and may be manufactured on a same wafer as (or on different wafers from) the active switching element. The functional elements and the active switching element may be on the same chip or die (or different chips or dice).

Next, as Step S105 shows, assemble the pre-manufactured active switching element to the display medium module. At this moment, the display medium module may still be in the process of being manufactured; for example, only after the active switching element is disposed on the second substrate of the display medium module are the display medium and the first substrate sequentially disposed on the second substrate. In addition, in Step S105, functional elements may also be simultaneously assembled to the display medium module.

Further, before performing Step S105, the pre-manufactured active switching element may be optionally packaged in a package carrier (e.g. in Step S103); the functional elements may also be simultaneously packaged in the package carrier. Therefore, if there is no need of a package carrier, S103 may be omitted.

Figure 7B:
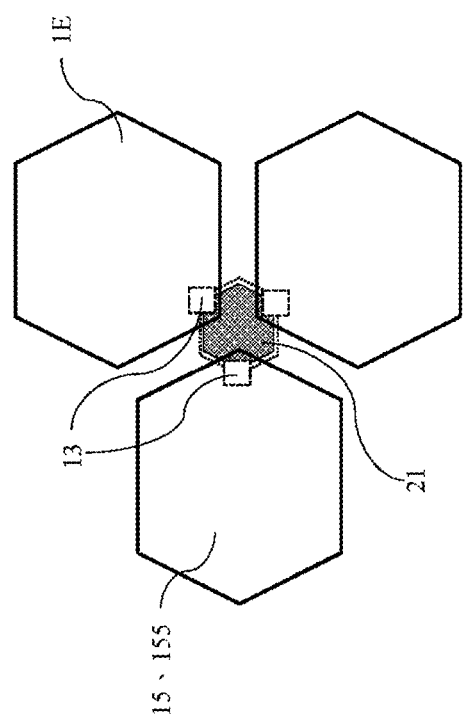
FIG. 7B is a detailed drawing showing the display device of FIG. 7A in partial enlargement.

Please refer to FIGS. 7A and 7B, showing a three-dimensional view and a partial enlargement view of a display device according to a sixth preferred embodiment of the present invention. The display device 2 may include a plurality of pixel unit structures 1E and a housing structure 31. The plurality of pixel unit structures 1E may be one of the foregoing pixel unit structures 1A to 1D or a technical combination thereof, and the plurality of pixel unit structures 1E are disposed in the housing structure 31. The housing structure 31 may include a transparent substrate (e.g. a glass or plastic substrate) for allowing the plurality of pixel unit structures 1E to be observed through the transparent substrate.

Further, if the display media 155 of the pixel unit structures 1E are made of non-self-luminous medium material, the display device 2 may further include a light source module 33, positioned on any side of the display medium module 15 of the plurality of pixel unit structures 1E (e.g. rear side, upper side, underside, front side, left side, right side) for providing light to the display medium module 15. If the display media 155 of the pixel unit structures 1E are made of self-luminous medium material or use ambient light illumination for its light source, the light source module 33 may be optionally omitted or turned off (i.e. the light source module 33 does not provide light); or, when the display media 155 made of self-luminous medium material do not provide sufficient light or when there is insufficient ambient light illumination, the light source module 33 may provide additional light.

Further, the pixel unit structure 1E may include a functional element 21 having the function of wireless communication. The functional element 21 may wirelessly receive the control signals and data signals from the control module 35 of the display device 2 and further transmit these signals to the active switching element 13. That is, the control module 35 may be electrically connected to the active switching element 13 without passing through a substantial wire (e.g. the control signal line 17 and the data signal line 19 as shown in FIG. 1). The control module 35 may wirelessly control the active switching element 13 to further control the state of the display medium 155. In addition, a functional element 21 with the function of wireless communication may simultaneously be electrically connected to the active switching elements 13 of a plurality of pixel unit structures 1E. Therefore, the total number of functional elements 21 may be fewer than the total number of active switching elements 13.

The foregoing functional element 21 with the function of wireless communication may be of (but not limited to) the following types: radio frequency (RF) wireless transmission, Zigbee wireless transmission, blue-tooth communication, infrared ray, wireless fidelity (Wi-Fi) wireless transmission, personal area networks (PAN), local area networks (LAN), near field communication (NFC), radio frequency identification (RFID), global system for mobile communication (GSM) and worldwide interoperability for microwave access (WiMAX), long-term evolution (LTE), 5th generation wireless communication and one of the combinations thereof.

Further, the shape combination of the display medium module 15 in a pixel unit structure 1E may be from (but not limited to) the following: square, rectangular, fan-shaped, triangular, trapezoid, round, polygonal, irregular, or one of the combinations thereof. In the present embodiment, the display medium module 15 is arranged as a hexagon for an example.

Figure 7C:
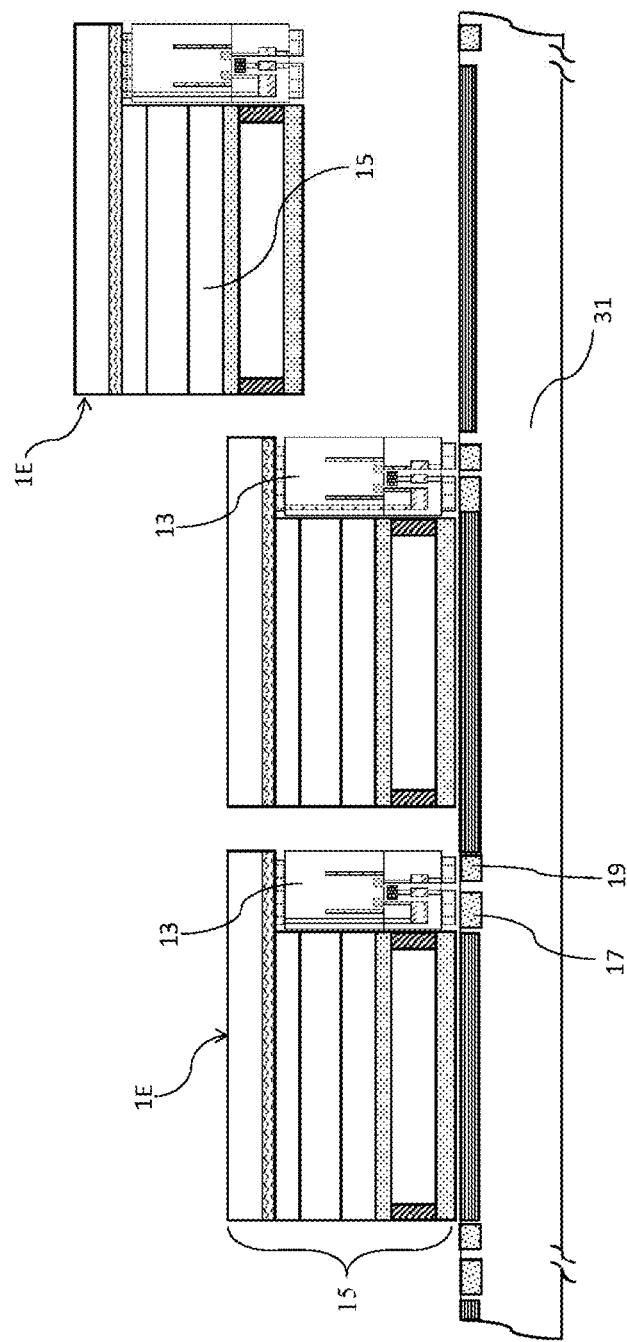
FIG. 7C is a partial cross-section view of the display device of FIG. 7A.

Further, as FIG. 7C shows, the pixel unit structures 1E may be arranged as independently assembled and disassembled, i.e. none of the elements of any pixel unit structure 1E is connected and integrated to any of the elements of another pixel unit structure 1E. Thus, each of the pixel unit structures 1E may be independently disassembled from the housing structure 31. Therefore, when one of the pixel unit structures 1E is damaged, it may be disassembled and replaced with a good pixel unit structure 1E.

Figure 8:
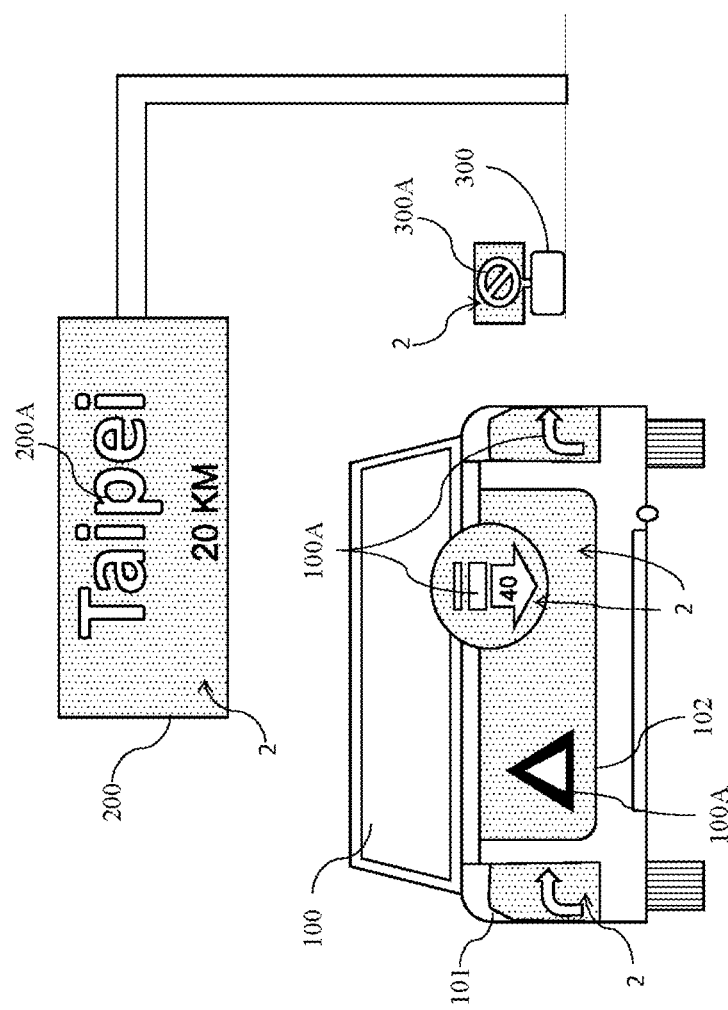
FIG. 8 is an application schematic view of the display device of FIG. 7A.

Please refer to FIG. 8, showing an application schematic view of the display device 2 of FIG. 7A. The display device 2 may not only be applied to electronic products such as computer and mobile phone but also to any product that may be equipped with a display function such as a transportation vehicle, wear products, building and billboard. Take a car 100 for an example, the display device 2 may serve as a rear car light 101 of the car 100 for showing images 100A of various kinds of driving information (e.g. turning, changing lanes, slowing down, speeding up, speed per hour, warning and the like) to other vehicles or pedestrians. In addition, with the functional element 21 of the pixel unit structure 1E, the display device 2 may be equipped with the functions of displacement sensing, hygrothermal sensing, acoustic sensing, electromagnetic sensing, image capturing and the like for sensing various environmental information outside the car.

Besides serving as a rear car light 101 of the car 100, the display device 2 may also serve as a front car light (not shown in the drawing), a dashboard (not shown in the drawing) and the like of the car 100 or may be disposed on the glass of the car 100. In addition, because the display medium module 15 of the plurality of pixel unit structures 1E of the display device 2 may be made of flexible material, or the plurality of pixel unit structures 1E may be independently assembled and disassembled, the display device 2 may be disposed along a curved shell 102 of the car 100 to serve as a lacquer or color painting design on the curved shell 102. This way, a user may easily change the lacquer or color painting design on the curved shell 102 and the curved shell 102 may also display images 100A of driving information.

The display device 2 may also be applied to a traffic notice board 200 for showing images 200A of destination, route and other information; the display device 2 may also be applied to a road warning device 300 for showing an image 300A to inform drivers of the road conditions ahead. The display device 2 may also serve as a road marker or road sign and the like.

The foregoing description illustrates the technical content of the pixel unit structure, a manufacturing method thereof, and a display device according to various preferred embodiments of the present invention. The foregoing description is illustrated of the present invention rather than limiting of the present invention. Any change easily made by those ordinarily skilled in the art of the present invention or any equivalent arrangement falls within the spirit and scope of the present invention, which is illustrated in the appended claims.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a pixel unit structure, comprising:
   manufacturing an active switching element in advance, the active switching element comprising a wafer portion and a transistor portion with the transistor portion formed physically contacting the wafer portion, and the wafer portion is part of a silicon wafer, gallium arsenide wafer, sapphire wafer, indium phosphide wafer or gallium nitride wafer; and
   assembling the active switching element on a display medium module, the display medium module comprising a first electrode disposed on a first substrate, a second electrode and a display medium, the first electrode and the second electrode are separated from each other, the display medium is disposed between the first electrode and the second electrode, the active switching element is electrically connected to the first electrode for allowing the first electrode and the second electrode to change the state of the display medium, and no element of the display medium module is connected to and/or integrated with any element of another display medium module.

2. The method of claim 1, wherein the display medium module further comprises & the first substrate and/or a second substrate, which are disposed facing each other and separated from each other;
   wherein the second electrode is disposed on the first substrate or the second substrate;
   wherein the active switching element is disposed on the first substrate and/or the second substrate.

3. The method of claim 2, wherein the first substrate or the second substrate is made of at least one of transparent material, opaque material, flexible material, rigid material, metallic material, ceramic material, insulating material, metal compound material, metal alloy material, organic material, inorganic material, composite material and semiconductor material.

4. The method of claim 2, further comprising a functional element disposed on the first substrate and/or the second substrate, the functional element comprising at least one of a displacement sensing functional element, a hygrothermal sensing functional element, an acoustic sensing functional element, an electromagnetic sensing functional element, a touch sensing functional element, an image capturing functional element, a memory functional element, a control functional element, a wireless communication functional element, a passive functional element, a self-luminous functional element, or a photovoltaic functional element.

5. The method of claim 2, wherein the first substrate and/or the second substrate comprise a concave groove and/or a through hole, and the active switching element is disposed in the concave groove and/or the through hole.

6. The method of claim 2, further comprising a control signal line and a data signal line, wherein the control signal line and the data signal line are formed on the first substrate and/or the second substrate of the display medium module and electrically connected to the active switching element.

7. The method of claim 1, wherein the active switching element is manufactured on a wafer by a semiconductor manufacturing process.

8. The method of claim 1, further comprising a package carrier, therein the active switching element is packaged in the package carrier before being assembled on the display medium module.

9. The method of claim 8, further comprising: package a functional element in the package carrier along with the active switching element, the functional element comprising at least one of a displacement sensing functional element, a hygrothermal sensing functional element, an acoustic sensing functional element, an electromagnetic sensing functional element, a touch sensing functional element, an image capturing functional element, a memory functional element, a control functional element, a wireless communication functional element, a passive functional element, a self-luminous functional element, or a photovoltaic functional element.

10. The method of claim 1, further comprising a carrier board, wherein the display medium module is disposed on the carrier board and the active switching element is disposed on the carrier board.

11. The method of claim 10, wherein the carrier board comprises a concave groove and/or a through hole and the active switching element is disposed in the concave groove and/or the through hole.

12. The method of claim 10, further comprising a control signal line and a data signal line, wherein the control signal line and the data signal line are formed on the carrier board and electrically connected to the active switching element.

13. The method of claim 1, wherein the display medium module further comprises an optical element optically coupled with the display medium and the optical element comprises at least one of a convex lens, a concave lens and an optical prism.

14. The method of claim 1, wherein the display medium comprises at least one of self-luminous medium material, non-self-luminous medium material, light-filtering material, electric conductive material, insulating material, light absorbing material, light reflecting material, photorefractive material, light deflecting material and light diffusing material.

15. The method of claim 14, wherein the non-self-luminous medium material comprises at least one of electrophoretic material, electric fluid material, liquid crystal material, micro electromechanical reflective material, electrowetting material, electric ink material, magnetic fluid material, electrochromic material, electromorphous material and thermochromic material; the self-luminous medium material may include at least one of electroluminescent material, photoluminescent material, cathodoluminescent material, field emissive luminescent material, vacuum fluorescent material and light-emitting diode material.

16. A method of manufacturing a display device, comprising:
the method of claim 1; and
manufacturing a housing structure;
wherein the pixel unit structure is disposed in the housing structure.

17. The method of claim 16, further comprising manufacturing a light source module, wherein light source module is disposed in the housing structure and positioned on any side of the display medium module of the pixel unit structure.

18. A method of manufacturing a pixel unit structure, comprising:
manufacturing an active switching element in advance, the active switching element comprising a wafer portion and a transistor portion with the transistor portion formed physically contacting the wafer portion; and
assembling the active switching element on a display medium module, the display medium module comprising a first substrate and/or a second substrate, which are disposed facing each other and separated from each other, a first electrode is disposed on the first substrate and a second electrode is disposed on the first substrate or the second substrate, the first electrode and the second electrode are separated from each other, and a display medium is disposed between the first electrode and the second electrode, the active switching element is electrically connected to the first electrode for allowing the first electrode and the second electrode to change the state of the display medium, and the wafer portion is different than the first substrate and the second substrate.

19. The method of claim 18, wherein the active switching element is disposed on at least one of the first substrate and/or the second substrate.

20. A method of manufacturing a display device, the method comprising:
manufacturing a control module having a wireless communication function;
manufacturing a pixel unit structure, the pixel unit structure manufactured by:
manufacturing an active switching element, the active switching element comprising a wafer portion and a transistor portion with the transistor portion formed physically contacting the wafer portion;
forming a first electrode on a substrate;
forming a second electrode on the substrate or on another substrate, wherein the first electrode and the second electrode are separated from each other;
forming a display medium between the first and the second electrodes; and
electrically connecting the active switching element to the first electrode for allowing the first electrode and the second electrode to change state of the display medium;
disposing the pixel structure in a housing structure of the display device; and
disposing a functional element in the housing structure of display device, the functional element having a wireless communication function configured to communicate wirelessly with the control module, the functional element electrically connected to the transistor portion of the active switching element of the pixel unit structure to control the state of the display medium of the pixel unit structure according to wireless communication received from the control module.

* * * * *